(12) United States Patent  
Su et al.

(10) Patent No.: US 8,938,136 B2
(45) Date of Patent: Jan. 20, 2015

(54) OPTO-ELECTRONIC SYSTEM HAVING FLIP-CHIP SUBSTRATE MOUNTING

(75) Inventors: Chung-Yi Su, Fremont, CA (US); Tak Kui Wang, Cupertino, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 364 days.

(21) Appl. No.: 13/569,364

(22) Filed: Aug. 8, 2012

(65) Prior Publication Data

US 2014/0044388 A1   Feb. 13, 2014

(51) Int. Cl.
  *G02B 6/12* (2006.01)
  *G02B 6/36* (2006.01)
(52) U.S. Cl.
  USPC .................................. 385/14; 385/89; 385/93
(58) Field of Classification Search
  None
  See application file for complete search history.

(56) References Cited

U.S. PATENT DOCUMENTS

| 7,539,366 | B1 | 5/2009 | Baks et al. |
| 7,999,383 | B2 | 8/2011 | Hollis |
| 2003/0143831 | A1* | 7/2003 | McDonough et al. ......... 438/615 |
| 2005/0254758 | A1* | 11/2005 | Kropp ............................. 385/89 |
| 2011/0052205 | A1 | 3/2011 | Yu et al. |
| 2012/0025209 | A1 | 2/2012 | Kim et al. |
| 2014/0241673 | A1* | 8/2014 | Chan .............................. 385/92 |

OTHER PUBLICATIONS

Chang, et al., "Ultra-fast VCSELs promise to turbocharge chip communication," Compound Semiconductor, Jun. 2008.

* cited by examiner

*Primary Examiner* — Hemang Sanghavi

(57) ABSTRACT

An opto-electronic system includes a system substrate, a lens, a bridging device, and an opto-electronic chip mounted in a cavity in the system substrate. The bridging device, which can be another chip, a lens block, or an interposer, is mounted in flip-chip orientation to the opto-electronic chip and provides electrical interconnection with signal conductors of the system substrate.

20 Claims, 15 Drawing Sheets

OPTO-ELECTRONIC SYSTEM HAVING FLIP-CHIP SUBSTRATE MOUNTING

BACKGROUND

In an optical communication system, it is generally necessary to couple an optical fiber to an opto-electronic transmitter, receiver or transceiver system and, in turn, to couple that opto-electronic system to an external electronic system such as a switching system or processing system. These connections can be facilitated by modularizing the transceiver or other opto-electronic system. A modularized opto-electronic transceiver system includes an opto-electronic light source, such as a laser, and an opto-electronic light receiver, such as a photodiode, and may also include various electronic circuitry associated with the laser and photodiode. For example, driver circuitry can be included for driving the laser in response to electronic signals received from the external electronic system. Receiver circuitry can be included for processing the signals produced by the photodiode and providing output signals to the external electronic system. One or more lenses are also commonly included.

In an opto-electronic transceiver module, the light source, light receiver, or transceiver (opto-electronic device) is commonly mounted on a substrate, such as a printed circuit board (PCB), and electrically connected by wirebonds to pads on the PCB. However, wirebonds suffer from disadvantages including parasitic effects and susceptibility to noise that can impact data transfer speed.

So-called "flip-chip" mounting is a known alternative to wirebonding. In flip-chip mounting, solder bumps are deposited on conductive pads on the upper surface of the chip (i.e., semiconductor die) during the final wafer processing step of the chip fabrication process. After the chip has been separated from the wafer (via the process known as dicing), the chip can be mounted on a substrate by inverting or flipping the chip over so that the solder bumps on its upper surface align with and make contact with corresponding conductive pads on the upper surface of the substrate. A reflow soldering process is then used to attach the solder bumps of the chip to the conductive pads of the substrate.

It has been suggested to employ flip-chip mounting in an opto-electronic module by mounting an opto-electronic device on the surface of a substrate such as a PCB over an aperture in the PCB, with the upper surface of the opto-electronic device facing the upper surface of the PCB. Electrical connections are made between solder bumps on the upper surface of the opto-electronic device and conductive pads on the upper surface of the PCB. In operation, optical signals can be communicated through the aperture in the PCB between the opto-electronic device and an external system below the PCB. There are various disadvantages to having to provide an aperture or other optical path through a PCB or similar substrate.

It would be desirable to employ flip-chip mounting in an opto-electronic system without having to provide an optical signal path through a PCB or other substrate on which the opto-electronic device of the system is mounted.

SUMMARY

Embodiments of the present invention relate to an opto-electronic system that includes a system substrate, a lens, a bridging device, and an opto-electronic chip mounted in a cavity in the system substrate. The bridging device, which can be, for example, another chip (e.g., a laser driver chip, signal receiver chip, or similar chip, collectively referred to herein as a processing chip) or a lens block with electrical traces, is mounted in a flip-chip orientation in relation to the opto-electronic chip.

In an exemplary embodiment, the system substrate has a substantially planar substrate upper surface and a substantially planar substrate lower surface. The substrate lower surface has an array of substrate lower electrical contacts. The substrate upper surface has substrate electrical conductors, including an array of substrate upper electrical contacts. The opto-electronic chip has an opto-electronic chip substrate on which at least one optical signal source, at least one optical signal detector, or a combination of both optical signal sources and detectors are formed. The optical signals associated with such structures are communicated through regions on the opto-electronic chip upper surface. The opto-electronic chip has a substantially planar opto-electronic chip upper surface through which the optical signals are communicated, and a substantially planar opto-electronic chip lower surface defined by the lower surface of the opto-electronic chip substrate. The opto-electronic chip upper surface also has an array of opto-electronic chip electrical contacts disposed in an orientation substantially co-planar with the chip substrate upper surface. A bridging device, which can be, for example, another chip (e.g., a laser driver chip, signal receiver chip, or similar chip, collectively referred to herein as a processing chip) or a lens block with electrical traces, is disposed between the lens and the opto-electronic chip upper surface. The bridging device has a substantially planar bridging device upper surface and a substantially planar bridging device lower surface. The bridging device lower surface has a first array of device electrical contacts in contact with at least a portion of the array of substrate upper electrical contacts. The bridging device lower surface also has a second array of device electrical contacts in contact with at least a portion of the array of opto-electronic chip electrical contacts. Thus, the bridging device electrically bridges the system substrate and the opto-electronic chip.

In an exemplary embodiment, a method of operation of an opto-electronic system includes: communicating optical signals through the opto-electronic chip upper surface and through the lens, communicating electrical signals between an external electronic device and an array of substrate lower electrical contacts on the substrate lower surface; communicating electrical signals between a first array of device electrical contacts on a lower surface of the bridging device and an array of substrate upper electrical contacts; and communicating electrical signals between a second array of device electrical contacts on the lower surface of the bridging device and at least a portion of an array of opto-electronic chip electrical contacts disposed on the opto-electronic chip upper surface in an orientation substantially co-planar with the system substrate upper surface.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
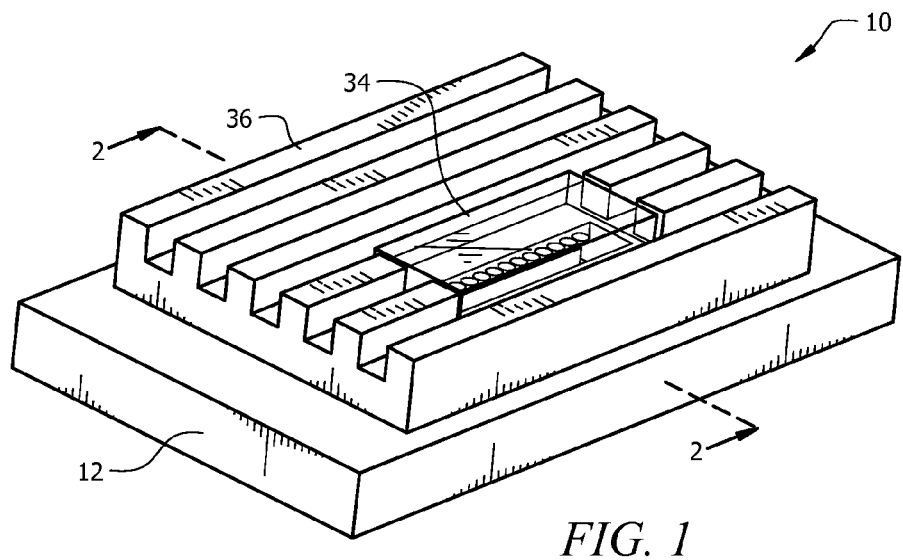
FIG. 1 is a perspective view of an opto-electronic system, in accordance with an exemplary embodiment of the invention.
Figure 2:
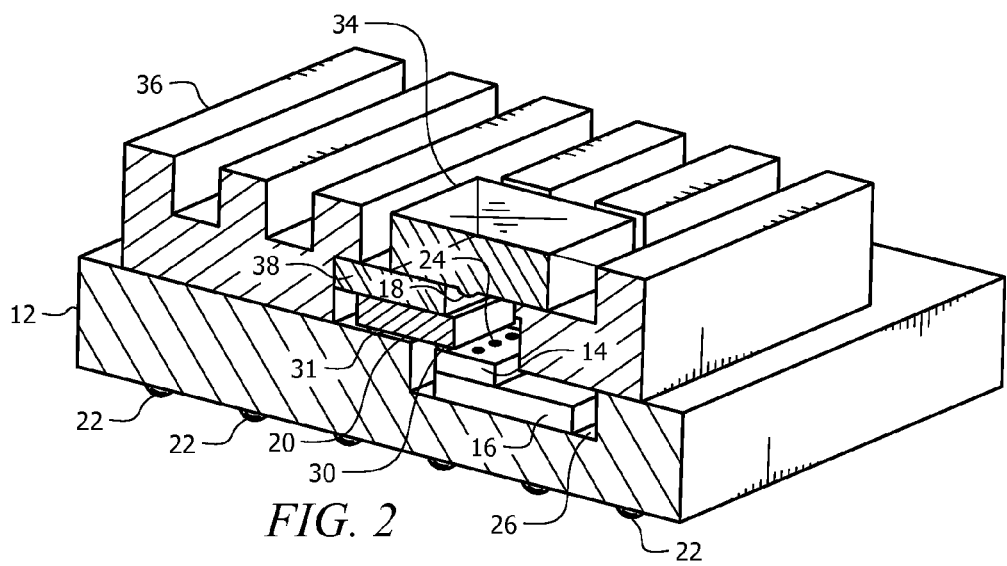
FIG. 2 is a sectional view taken on line 2-2 of FIG. 1.

As illustrated in FIGS. 1-2, in an illustrative or exemplary embodiment of the invention, an opto-electronic system 10 includes a system substrate 12, an opto-electronic chip 14, a heat spreader 16, lenses 18, and a processing chip 20. The lower surface of system substrate 12 has an array of substrate lower electrical contacts 22 (FIG. 2), such as a ball grid array (BGA), to facilitate electrical mounting of opto-electronic system 10 to a surface of a printed circuit board (not shown) of an external system.

Opto-electronic chip 14 includes one or more optical signal sources, such as lasers. However, in other embodiments such an opto-electronic chip can alternatively include one or more optical signal detectors, such as photodiodes, or can include a combination of both optical signal sources optical signal detectors. An example of an optical signal source is a vertical cavity surface emitting laser (VCSEL). As well understood in the art, a VCSEL chip includes a layered semiconductor structure or optical region that is formed using photolithographic or similar techniques on a chip substrate such as gallium arsenide. The VCSEL structure emits optical (i.e., light) signals from the optical region within the structure in a direction normal to a major plane of the chip substrate and through VCSEL regions 24 on the upper surface of opto-electronic (VCSEL) chip 14. In the illustrated embodiment, opto-electronic chip 14 has an array or plurality of such VCSEL structures and corresponding VCSEL regions 24 on the upper surface. As also well understood in the art, a photodiode chip or other optical signal detector (not shown) can similarly include a semiconductor structure or optical region that is formed using photolithographic or similar techniques on a substrate such as gallium arsenide. In embodiments (not shown) having a photodiode chip, an optical region of a photodiode structure receives optical signals through a corresponding region on the upper surface of such an opto-electronic (photodiode) chip in a direction normal to a major plane of the substrate.

Although for purposes of illustration the exemplary embodiment shown in FIGS. 1-2 includes only a single monolithic opto-electronic chip 14, other embodiments can include more than one such opto-electronic chip, each having one or more VCSELs or other optical signal sources. In an embodiment (not shown) in which each of a number of opto-electronic chips includes an optical signal source, the optical signal source of each such opto-electronic chip can be electrically isolated from the optical signal sources of the other opto-electronic chips.

System substrate 12 can be a multi-layer laminate structure made of a suitable organic printed circuit board (PCB) material, such as that commonly known as FR4. As well understood in the art, such PCB material is a poor heat conductor. The lower surface of opto-electronic chip 14, which is defined by the lower surface of the chip substrate on which the VCSEL structures are formed, generates heat when the VCSELs are in operation. This heat is concentrated at localized regions of the chip substrate beneath the optical regions of the VCSEL structures. Such localized heat can damage the VCSEL structures or impair their efficient operation.

To de-localize or spread the heat away from the VCSEL structures, heat spreader 16 is mounted at the bottom of a recess or cavity 26 (FIG. 3) in the upper surface of system substrate 12. More specifically, the upper surface of heat spreader 16 is in thermal contact with the lower surface of opto-electronic chip 14, and the lower surface of heat spreader 16 is mounted to the bottom wall or surface of cavity 26. Heat spreader 16 can have a substantially planar shape, similar to that of opto-electronic chip 14, such that heat spreader 16 and opto-electronic chip 14 are parallel to each other with respect to their major planes. Heat spreader 16 can be made of a material that is both a good thermal conductor and a good electrical insulator or dielectric, such as aluminum nitride (AlN). Aluminum nitride is a type of ceramic material and has a thermal conductivity of approximately 285 watts per meter kelvin (W/m·K). Other thermally conductive ceramic materials (e.g., having a thermal conductivity greater than about 100 W/m·K) may also be suitable.

In embodiments (not shown) in which each of a number of opto-electronic chips includes an optical signal source, individually mounting such opto-electronic chips on the heat spreader can help electrically isolate the optical signal sources from each other. Processing chip 20 includes circuitry for driving the VCSELs or other optical signal sources of opto-electronic chip 14. In embodiments that include optical signal detectors (not shown), such a processing chip can include circuitry for receiving the signals produced by the optical signal detectors. Processing chip 20 is electrically coupled to opto-electronic chip 14 such that the signal driver circuitry of processing chip 20 provides electrical signals to the optical signal sources and, in embodiments having optical signal detectors, the signal receiver circuitry of processing chip 20 receives electrical signals produced by the optical signal detectors. This electrical coupling is provided by an array of electrical contacts 28 (FIG. 5), such as solder bumps, on the upper surface of opto-electronic chip 14 in contact with a corresponding array of electrical contacts 30 (FIG. 2), such as conductive pads, on the lower surface of processing chip 20. In other embodiments (not shown), copper pillars or other electrical contact technology can be employed instead of the combination of solder bumps and conductive pads.

Processing chip 20 is also electrically coupled to electrical conductors, such as circuit traces and vias, of system substrate 12. Some of these substrate electrical conductors, including an array of electrical contacts 32 (FIGS. 3-5), such as conductive pads, are formed on the upper surface of system substrate 12. Other such substrate electrical conductors, such as circuit traces and vias, are not shown for purposes of clarity. The electrical coupling is provided by an array of electrical contacts 31 (FIG. 2), such as solder bumps, on the lower surface of processing chip 20 in contact with the corresponding array of electrical contacts 32. In other embodiments (not shown), copper pillars or other electrical contact technology can be employed instead of the combination of solder bumps and conductive pads.

Note that processing chip 20 serves as a bridge or interface between opto-electronic chip 14 and system substrate 12 by processing electronic signals that it communicates with both opto-electronic chip 14 and system substrate 12. In operation of opto-electronic system 10, processing chip 20 controls opto-electronic chip 14 in response to signals that processing chip 20 receives from system substrate 12 (which system substrate 12, in turn, receives from an external system (not shown) on which it is mounted). Processing chip 20 also serves as a bridge in a mechanical sense in that it straddles or bridges opto-electronic chip 14 and system substrate 12. This mechanical bridging is facilitated by the upper surface of opto-electronic chip 14 and its array of electrical contacts 28 being substantially co-planar or level with the upper surface of system substrate 12 and its array of electrical contacts 32.

Lenses 18 are formed in an array on the lower surface of a lens block 34. Thus, processing chip 20 is sandwiched between opto-electronic chip 14 and lens block 34. Each individual lens 18 (FIG. 2) can comprise, for example, a convex bulge on the lower surface of lens block 34. In operation, optical signals emitted from the array of VCSEL regions 24 impinge upon corresponding lenses 18. Lenses 18 focus these signals or beams, which pass through lens block 34 and are emitted from the upper surface of lens block 34.

A heat sink 36 is mounted over cavity 26 on the upper surface of system substrate 12. Another substantially planar heat spreader 38 can be sandwiched between processing chip 20 and heat sink 36. That is, the lower surface of heat spreader 38 is in thermal contact with the upper surface of processing chip 20, and the upper surface of heat spreader 38 is in thermal contact with the lower surface of heat sink 36. It can also be noted that lens block 34 is mounted partly on heat sink 36 and partly on heat spreader 38. However, in other embodiments such a lens block can be mounted on only the heat sink or in any other suitable configuration. Also, as this other heat spreader 38 need not be electrically insulative, it can be made of a highly thermally conductive material such as, for example, copper. In embodiments not having such a heat spreader, the lower surface of the heat sink can be in direct thermal contact with the upper surface of the processing chip. Although not shown for purposes of clarity, a thin layer of thermally conductive paste can be provided between adjoining surfaces of elements that are in thermal contact with each other.

Figure 3:
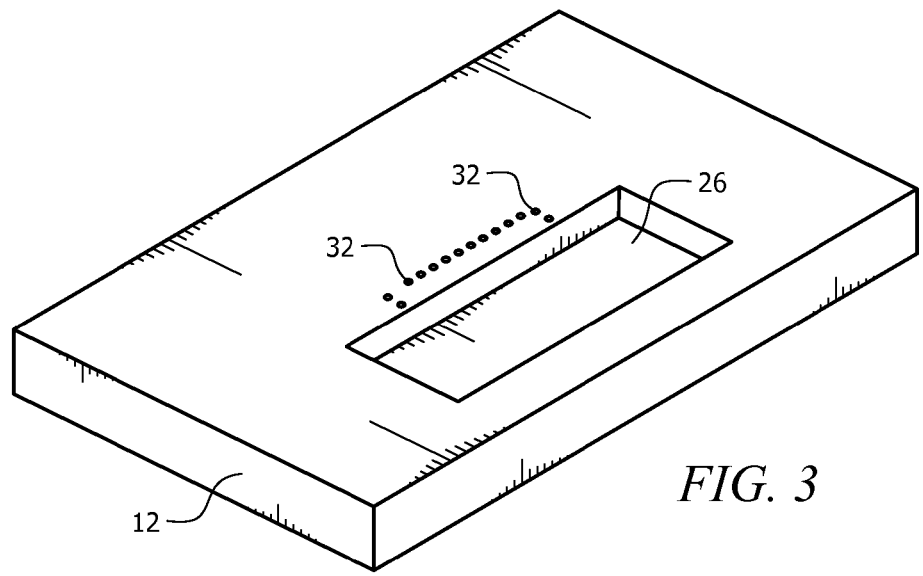
FIG. 3 is a perspective view illustrating a first step in an exemplary method of making the opto-electronic system of FIG. 1.
Figure 4:
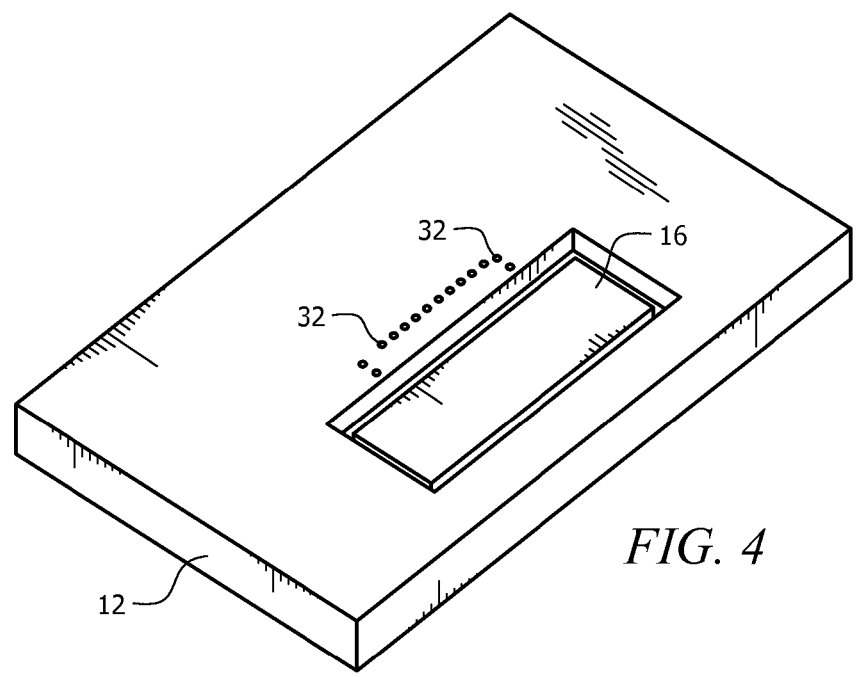
FIG. 4 is a perspective view illustrating a second step in an exemplary method of making the opto-electronic system of FIG. 1.
Figure 5:
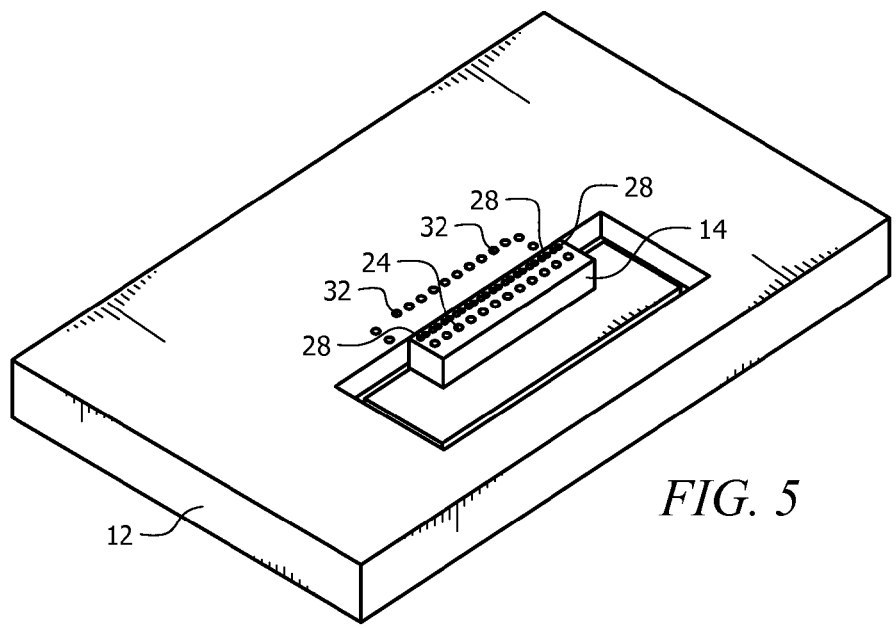
FIG. 5 is a perspective view illustrating a third step in an exemplary method of making the opto-electronic system of FIG. 1.
Figure 6:
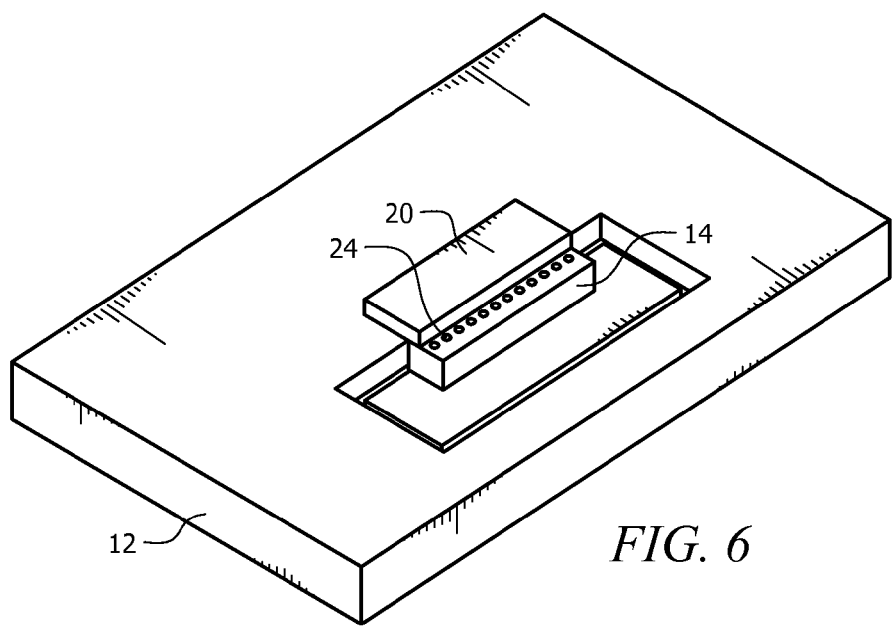
FIG. 6 is a perspective view illustrating a fourth step in an exemplary method of making the opto-electronic system of FIG. 1.
Figure 7:
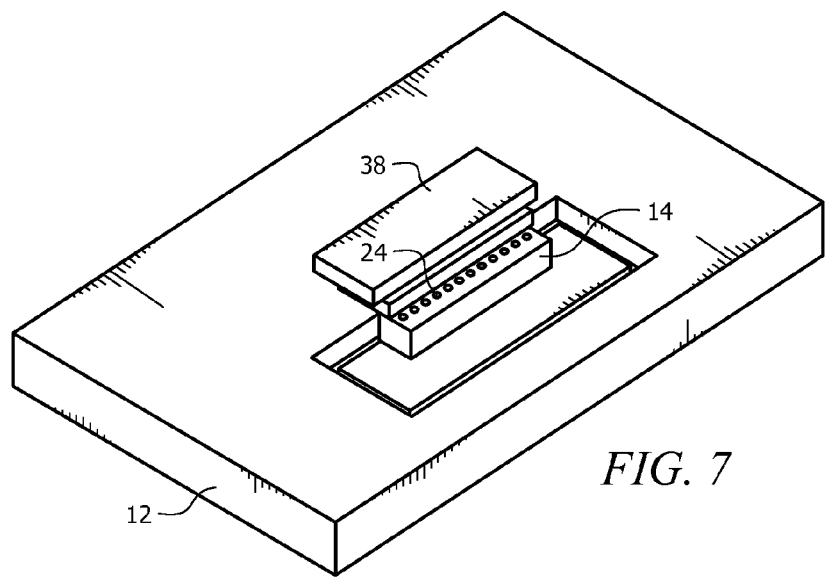
FIG. 7 is a perspective view illustrating a fifth step in an exemplary method of making the opto-electronic system of FIG. 1.
Figure 8:
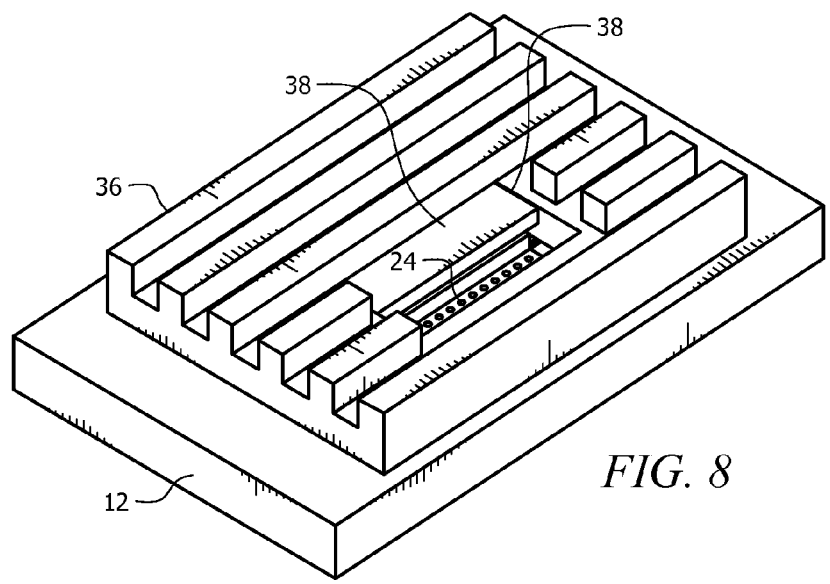
FIG. 8 is a perspective view illustrating a sixth step in an exemplary method of making the opto-electronic system of FIG. 1.
Figure 9:
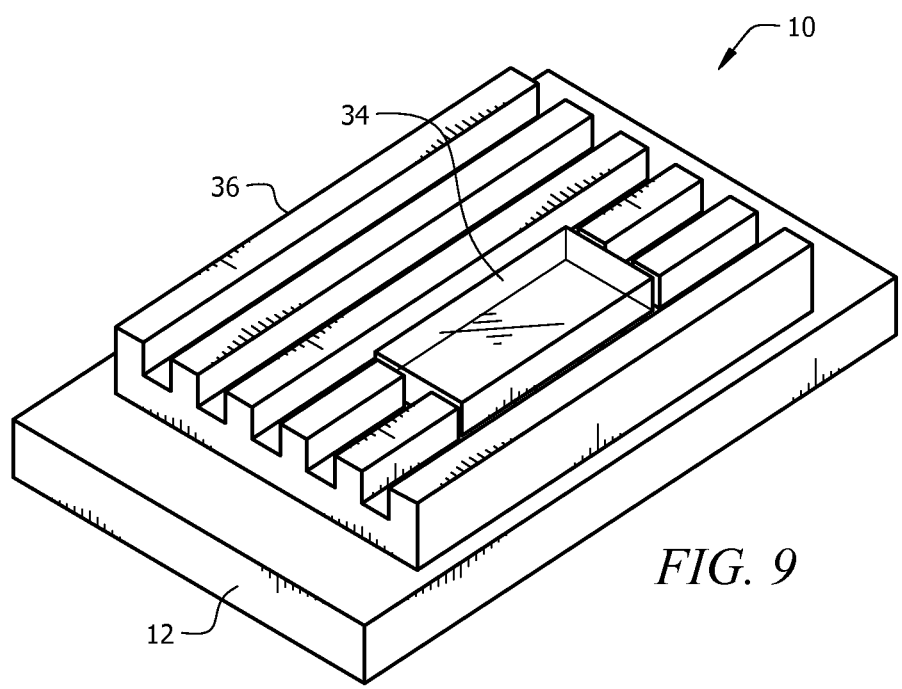
FIG. 9 is a perspective view illustrating a seventh step in an exemplary method of making the opto-electronic system of FIG. 1.

An exemplary method for fabricating opto-electronic system 10 can be described with reference to FIGS. 3-9. As illustrated in FIG. 3, cavity 26 is first formed in system substrate 12. Heat spreader 16 is then mounted in cavity 26 of system substrate 12 using, for example, a thermally conductive epoxy. As discussed above, heat spreader 16 can be made of, for example, aluminum nitride, and system substrate 12 can be made of an organic PCB material. Then, as illustrated in FIG. 5, opto-electronic chip 14, such as a VCSEL chip, is mounted on the upper surface of heat spreader 16, such that the upper surface of opto-electronic chip 14 and its array of electrical contacts 28 are substantially co-planar or level with the upper surface of system substrate 12 and its array of electrical contacts 32. As illustrated in FIG. 6, processing chip 20 is then mounted on the upper surfaces of both system substrate 12 and opto-electronic chip 14 such that it straddles or bridges system substrate 12 and opto-electronic chip 14. Then, as illustrated in FIG. 7, the other heat spreader 38 is mounted on the upper surface of processing chip 20. As illustrated in FIG. 8, heat sink 36 is then mounted on the upper surface of system substrate 12. Finally, lens block 34 is mounted on portions of the upper surfaces of both heat sink 36 and heat spreader 38, as illustrated in FIG. 9. Lens block 34 can be made of a suitable material that is transparent to the wavelengths emitted by opto-electronic chip 14, such as glass or plastic.

Figure 10:
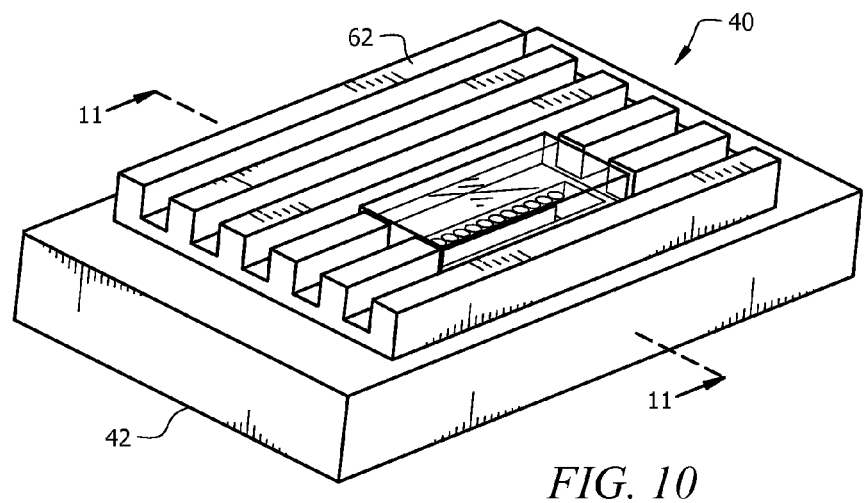
FIG. 10 is a perspective view of an opto-electronic system, in accordance with another exemplary embodiment of the invention.
Figure 11:
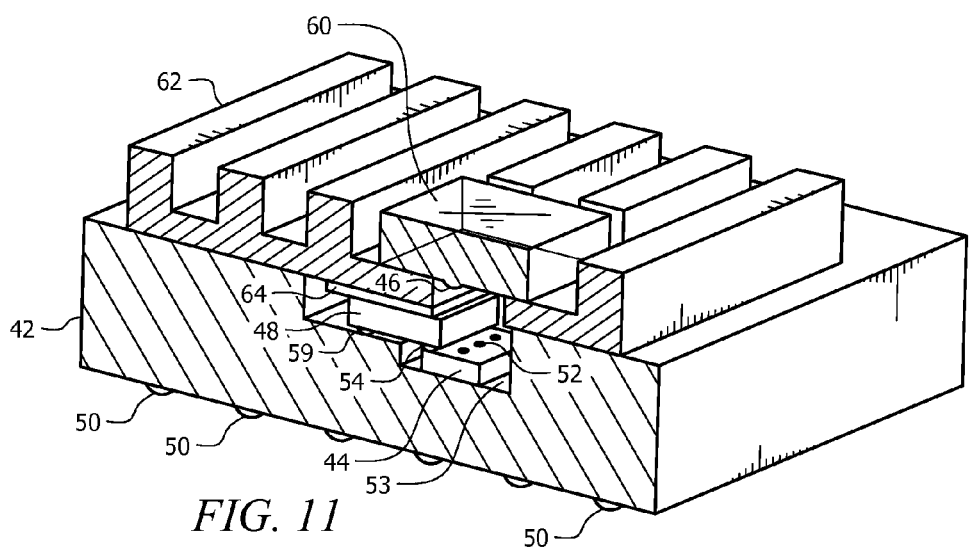
FIG. 11 is a sectional view taken on line 11-11 of FIG. 10.

As illustrated in FIGS. 10-11, in another exemplary embodiment of the invention, an opto-electronic system 40 includes a system substrate 42, an opto-electronic chip 44, lenses 46, and a processing chip 48. The lower surface of system substrate 42 has an array of substrate lower electrical contacts 50 (FIG. 11), such as a ball grid array (BGA), to facilitate electrical mounting of opto-electronic system 40 to a surface of a printed circuit board (not shown) of an external system.

As opto-electronic chip 44 can be similar to above-described opto-electronic chip 14, opto-electronic chip 44 is not described in similar detail for purposes of clarity. Accordingly, in this embodiment opto-electronic chip 44 has an array or plurality VCSEL structures and corresponding VCSEL regions 52 on its upper surface. Although for purposes of illustration the exemplary embodiment shown in FIGS. 10-11 includes only a single monolithic opto-electronic chip 44, other embodiments can include more than one such opto-electronic chip, each having one or more VCSELs or other optical signal sources. In an embodiment (not shown) in which each of a number of opto-electronic chips includes an optical signal source, the optical signal source of each such opto-electronic chip can be electrically isolated from the optical signal sources of the other opto-electronic chips.

System substrate 42 can be made of a thermally conductive ceramic material, such as aluminum nitride. Other thermally conductive ceramic materials (e.g., having a thermal conductivity greater than about 100 W/m·K) may also be suitable. Opto-electronic chip 44 is mounted at the bottom of a recess or cavity 53 (FIG. 12) in the upper surface of system substrate 42.

As processing chip 48 can be similar to above-described processing chip 20, processing chip 48 is not described in similar detail for purposes of clarity. Similarly to the above-described embodiment, the lower surface of processing chip 48 has an array of electrical contacts 54 (FIG. 11), such as conductive pads, which are in contact with a corresponding array of electrical contacts 56 (FIG. 13), such as solder bumps, on the upper surface of opto-electronic chip 44. In other embodiments (not shown), copper pillars or other electrical contact technology can be employed instead of the combination of solder bumps (solder bumps) and conductive pads.

Processing chip 48 is also electrically coupled to electrical conductors, such as circuit traces and vias, of system substrate 42. Some of these substrate electrical conductors, including an array of electrical contacts 58 (FIGS. 12-13), such as conductive pads, are formed on the upper surface of system substrate 42. The electrical coupling is provided by an array of electrical contacts 59 (FIG. 11), such as solder bumps, on the lower surface of processing chip 48 in contact with the corresponding array of electrical contacts 58. In other embodiments (not shown), copper pillars or other electrical contact technology can be employed instead of the combination of solder bumps and conductive pads.

Processing chip 48 serves as a bridge or interface between opto-electronic chip 44 and system substrate 42 by processing electronic signals that it communicates with both opto-electronic chip 44 and system substrate 42. In operation of opto-electronic system 40, processing chip 48 controls opto-electronic chip 44 in response to signals that processing chip 48 receives from system substrate 42 (which system substrate 42, in turn, receives from an external system (not shown) on which it is mounted). Processing chip 48 also serves as a bridge in a mechanical sense in that it straddles or bridges opto-electronic chip 44 and system substrate 42. This mechanical bridging is facilitated by the upper surface of opto-electronic chip 44 and its array of electrical contacts 56 (FIG. 13) being substantially co-planar or level with a shelf-like portion of the upper surface of system substrate 42 and its array of electrical contacts 58.

Lenses 46 are formed in an array on the lower surface of a lens block 60. Thus, processing chip 48 is sandwiched between opto-electronic chip 44 and lens block 60. In operation, optical signals emitted from the array of VCSEL regions 52 impinge upon corresponding lenses 46. Lenses 46 focus these signals or beams, which pass through lens block 60 and are emitted from the upper surface of lens block 60.

A heat sink 62 is mounted over cavity 53 on the upper surface of system substrate 42. As in the embodiment described above, another substantially planar heat spreader 64 can be sandwiched between processing chip 48 and heat sink 62. As this other heat spreader 64 need not be electrically insulative, it can be made of a highly thermally conductive material such as, for example, copper. In embodiments not having such a heat spreader, the lower surface of the heat sink can be in direct thermal contact with the upper surface of the processing chip.

Figure 12:
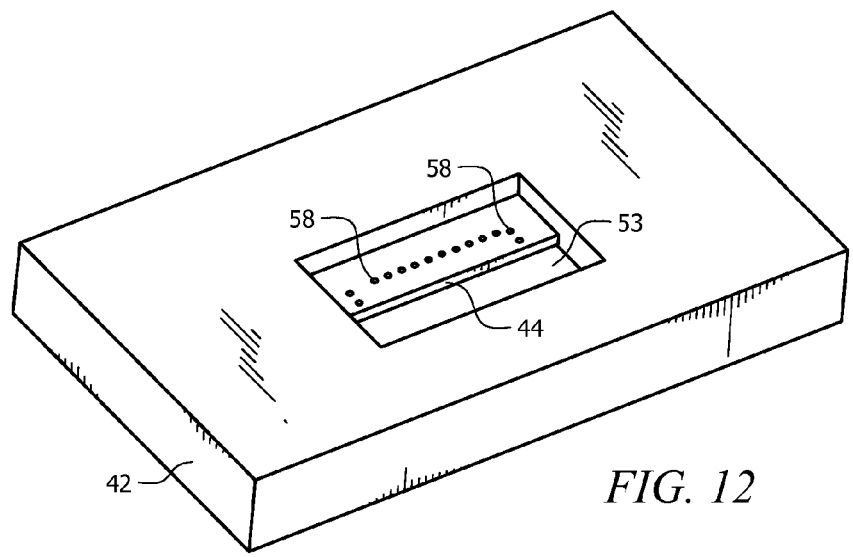
FIG. 12 is a perspective view illustrating a first step in an exemplary method of making the opto-electronic system of FIG. 10.

An exemplary method for fabricating opto-electronic system 40 can be described with reference to FIGS. 12-16. As illustrated in FIG. 12, cavity 53 is first formed in system substrate 42. In the illustrated embodiment, cavity 53 has a stepped shape, with a lower portion of cavity 53 serving to receive opto-electronic chip 44 processing chip 54. Electrical contacts 58 are formed on the upper step or shelf in cavity 53. However, in other embodiments such a cavity can have no steps or more than one step.

Figure 13:
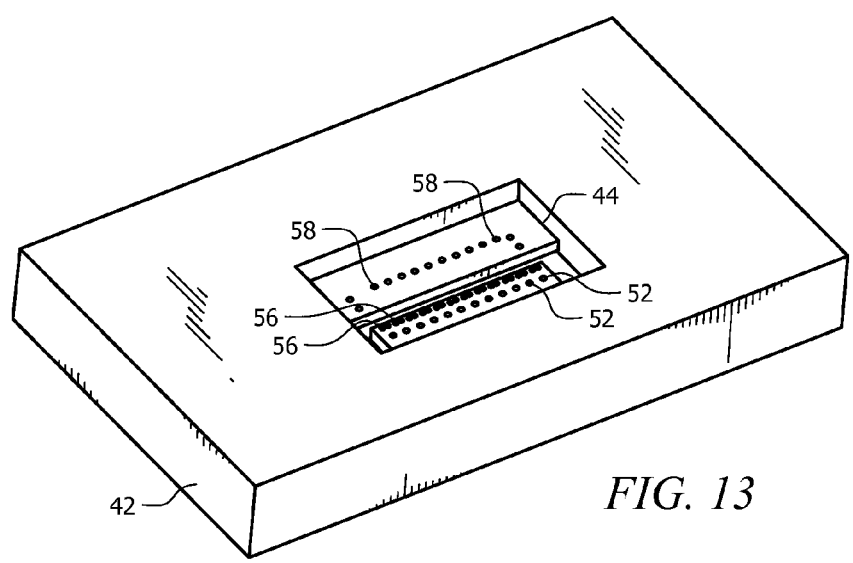
FIG. 13 is a perspective view illustrating a second step in an exemplary method of making the opto-electronic system of FIG. 10.
Figure 14:
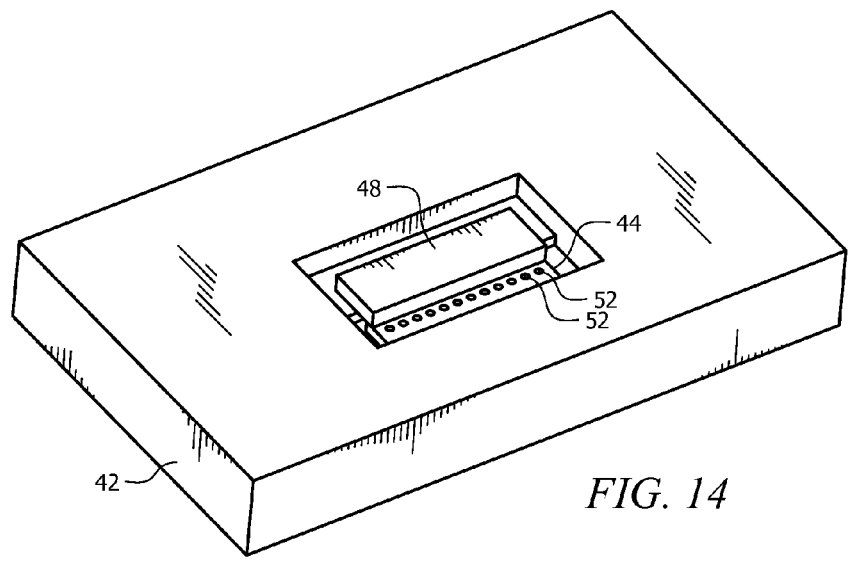
FIG. 14 is a perspective view illustrating a third step in an exemplary method of making the opto-electronic system of FIG. 10.
Figure 15:
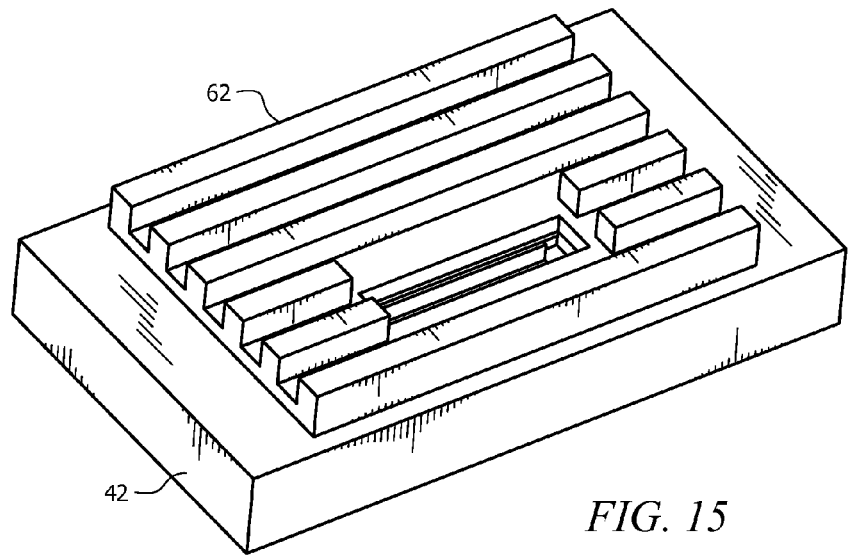
FIG. 15 is a perspective view illustrating a fourth step in an exemplary method of making the opto-electronic system of FIG. 10.
Figure 16:
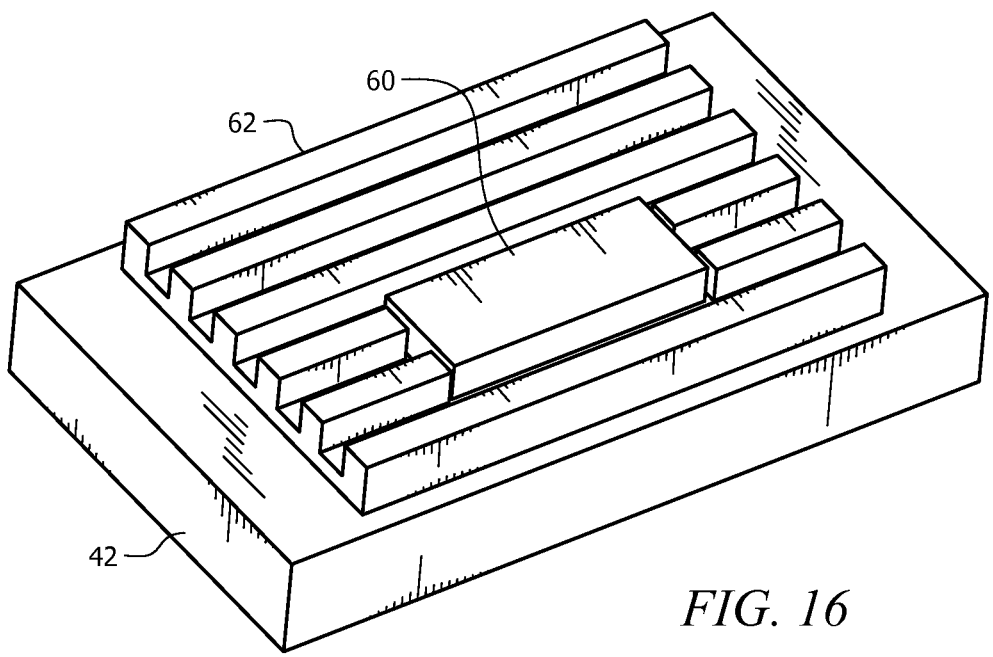
FIG. 16 is a perspective view illustrating a fifth step in an exemplary method of making the opto-electronic system of FIG. 10.

As illustrated in FIG. 13, opto-electronic chip 44 is then mounted in the lower portion of cavity 53, such that the upper surface of opto-electronic chip 44 and its array of electrical contacts 56 are substantially co-planar or level with the upper step or surface of cavity 53 and its array of electrical contacts 58. As illustrated in FIG. 14, processing chip 48 is then mounted on the upper surfaces of both the shelf in cavity 53 and opto-electronic chip 44 such that it straddles or bridges opto-electronic chip 44 and a surface of system substrate 42. After heat spreader 64 (FIG. 11) is mounted on the upper surface of processing chip 48, heat sink 62 is mounted on the upper surface of system substrate 42, as illustrated in FIG. 15. Finally, lens block 60 is mounted on portions of the upper surfaces of both heat sink 62 and heat spreader 64, as illustrated in FIG. 16.

Figure 17:
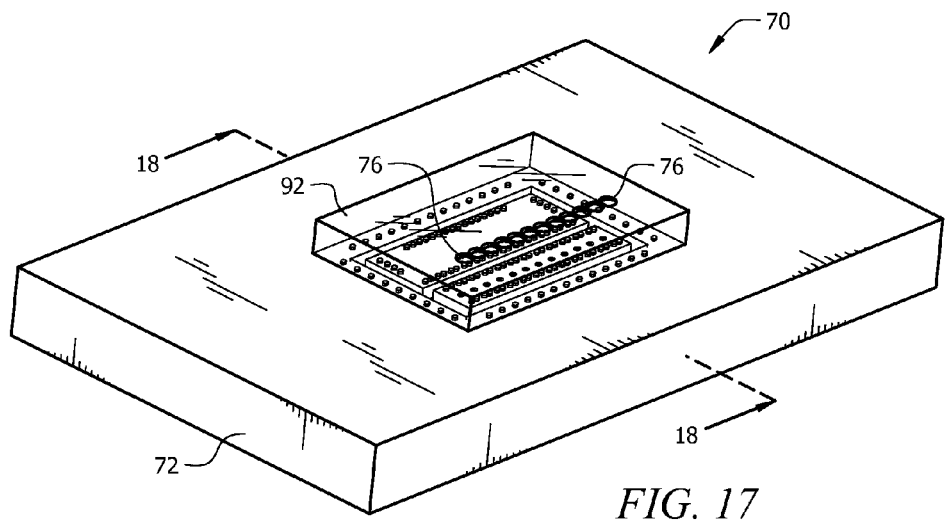
FIG. 17 is a perspective view of an opto-electronic system, in accordance with still another exemplary embodiment of the invention.
Figure 18:
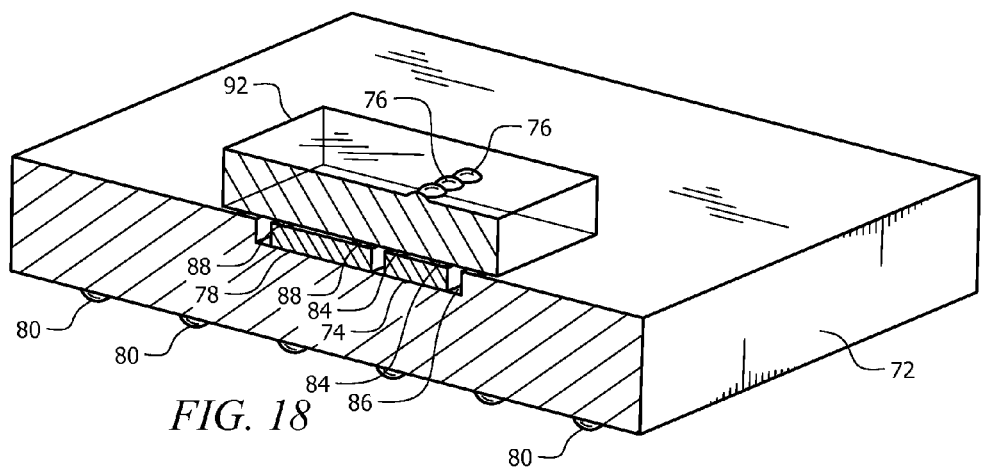
FIG. 18 is a sectional view taken on line 18-18 of FIG. 17.

As illustrated in FIGS. 17-18, in yet another exemplary embodiment of the invention, an opto-electronic system 70 includes a system substrate 72, an opto-electronic chip 74, lenses 76, and a processing chip 78. The lower surface of system substrate 72 has an array of substrate lower surface contacts 80 (FIG. 18), such as a ball grid array (BGA), to facilitate electrical mounting of opto-electronic system 70 to a surface of a printed circuit board (not shown) of an external system.

As opto-electronic chip 74 can be similar to above-described opto-electronic chips 14 and 44, opto-electronic chip 74 is not described in similar detail for purposes of clarity. Accordingly, in this embodiment opto-electronic chip 74 has an array or plurality VCSEL structures and corresponding VCSEL regions 82 (FIG. 22) on its upper surface. The upper surface of opto-electronic chip 74 has an array of electrical contacts 84, such as solder bumps. Although for purposes of illustration the exemplary embodiment shown in FIGS. 17-18 includes only a single monolithic opto-electronic chip 74, other embodiments can include more than one such opto-electronic chip, each having one or more VCSELs or other optical signal sources. In an embodiment (not shown) in which each of a number of opto-electronic chips includes an optical signal source, the optical signal source of each such opto-electronic chip can be electrically isolated from the optical signal sources of the other opto-electronic chips.

System substrate 72 can be made of a thermally conductive ceramic material, such as aluminum nitride. Other thermally conductive materials (e.g., having a thermal conductivity greater than about 100 W/m·K) may also be suitable. Opto-electronic chip 74 is mounted at the bottom of a recess or cavity 86 (FIG. 21) in the upper surface of system substrate 72.

As processing chip 78 can be similar to above-described processing chips 20 and 48, processing chip 78 is not described in similar detail for purposes of clarity. The upper surface of processing chip 78 has an array of electrical contacts 88 (FIG. 18), such as solder bumps.

Although not shown for purposes of clarity, system substrate 72 includes various electrical conductors, such as circuit traces and vias. Some of these substrate electrical conductors, including an array of electrical contacts 90 (FIG. 21), such as conductive pads, are formed on the upper surface of substrate 72. Other such substrate electrical conductors are not shown for purposes of clarity.

Figure 19:
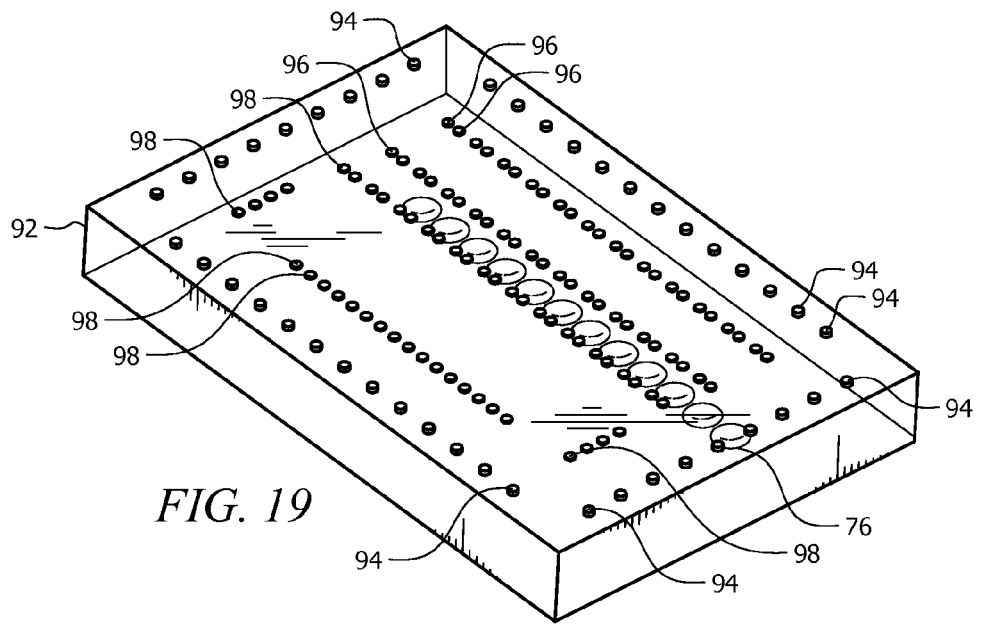
FIG. 19 is a perspective view illustrating a first step in an exemplary method of making the opto-electronic system of FIG. 17.
Figure 20:
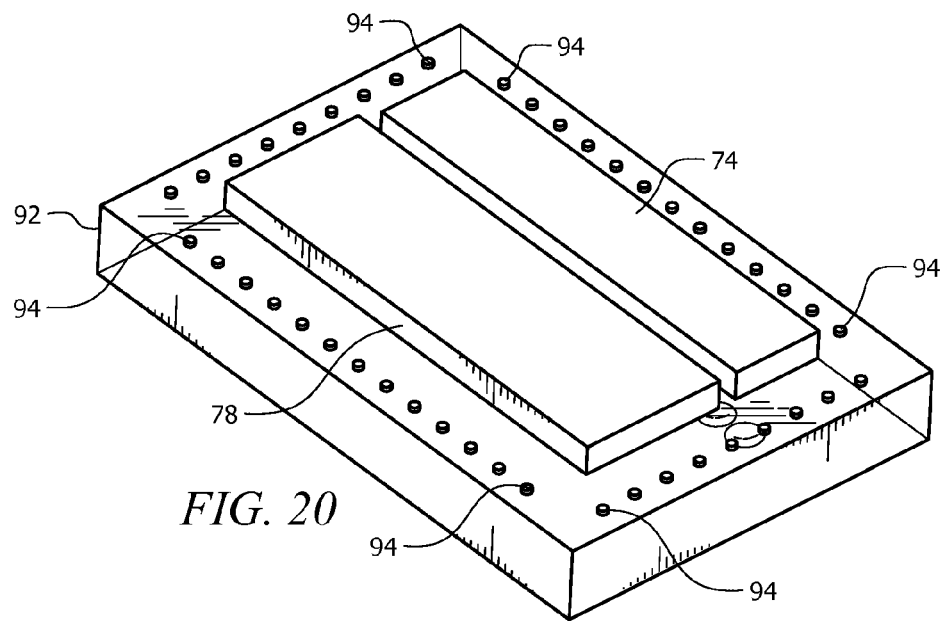
FIG. 20 is a perspective view illustrating a second step in an exemplary method of making the opto-electronic system of FIG. 17.

Lenses 76 are formed in an array on the upper surface of a lens block 92. Lens block 92 includes electrical conductors, such as circuit traces, which are formed on the lower surface of lens block 92 but are not shown for purposes of clarity. As illustrated in FIGS. 19-20, these lens block electrical conductors include arrays of electrical contacts 94, 96 and 98 on the lower surface of lens block 92. In this embodiment, lens block 92 serves as a bridge or interface between opto-electronic chip 74 and processing chip 78 and also between processing chip 78 and system substrate 72 because the lens block electrical conductors route electronic signals among opto-electronic chip 74, processing chip 78 and system substrate 72. The electrical coupling between system substrate 72 and lens block electrical conductors is provided by the array of electrical contacts 94 on the lower surface of lens block 92 in contact with the array of electrical contacts 90 on the upper surface of system substrate 72. The electrical coupling between opto-electronic chip 74 and lens block electrical conductors is provided by the array of electrical contacts 96 on the lower surface of lens block 92 in contact with the array of electrical contacts 84 on the upper surface of opto-electronic chip 74. The electrical coupling between processing chip 78 and lens block electrical conductors is provided by the array of electrical contacts 98 on the lower surface of lens block 92 in contact with the array of electrical contacts 88 on the upper surface of processing chip 78. In operation of opto-electronic system 70, processing chip 78 controls opto-electronic chip 74 in response to signals that processing chip 78 receives from system substrate 72 via the electronic conductors of lens block 92.

Note that in this embodiment lens block 92 also serves as a bridge in a mechanical sense in that it is mounted atop and spans system substrate 72, opto-electronic chip 74, and processing chip 78. This mechanical bridging is facilitated by the upper surface of opto-electronic chip 74 and its array of electrical contacts 84 (FIG. 18) being substantially co-planar or level with the upper surface of processing chip 78 and its array of electrical contacts 88 as well as being substantially co-planar or level with the upper surface of system substrate 72 and its arrays of electrical contacts 94, 96 and 98.

Thus, both opto-electronic chip 74 and processing chip 78 are sandwiched between system substrate 72 and lens block 92. In operation, optical signals emitted from the array of VCSEL regions 82 (FIG. 22) pass through lens block 92 and impinge upon corresponding lenses 76. Lenses 76 focus and emit these signals or beams.

An exemplary method for fabricating opto-electronic system 70 can be described with reference to FIGS. 19-22. As illustrated in FIG. 19, lens block 92 is fabricated, including providing conductive traces and the arrays of electrical contacts 94, 96 and 98, or other lens block electrical conductors.

Figure 21:
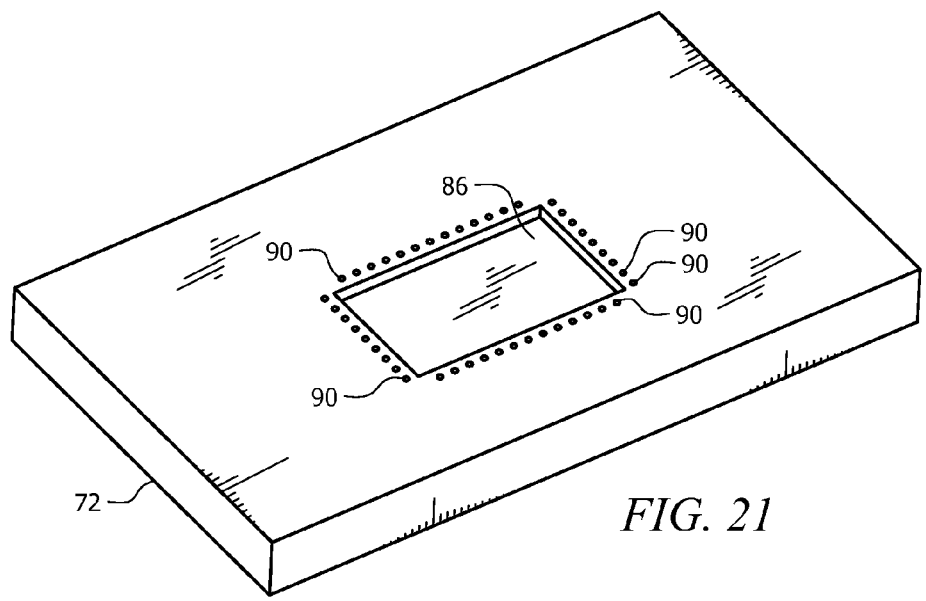
FIG. 21 is a perspective view illustrating a third step in an exemplary method of making the opto-electronic system of FIG. 17.
Figure 22:
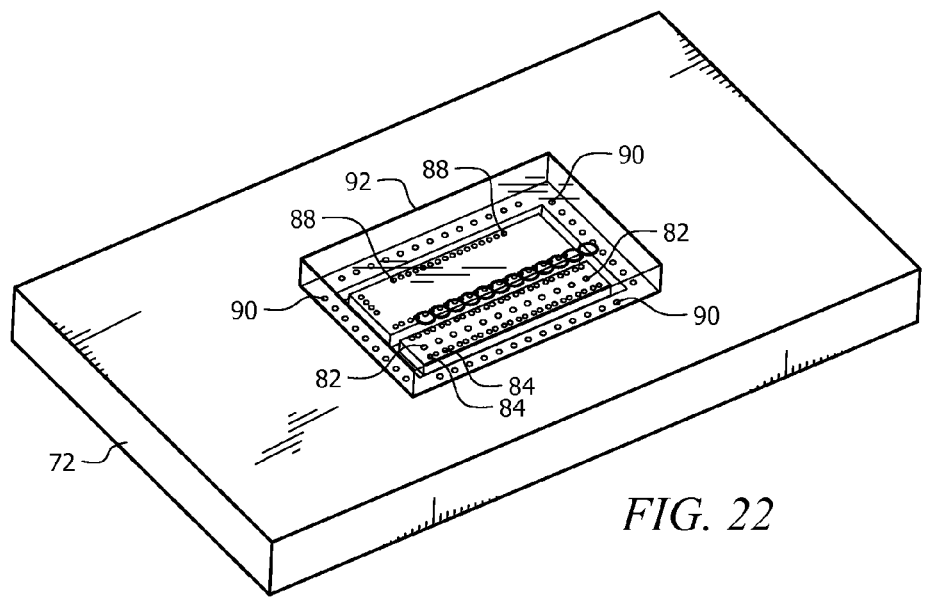
FIG. 22 is a perspective view illustrating a fourth step in an exemplary method of making the opto-electronic system of FIG. 17.

Then, as illustrated in FIG. 20, opto-electronic chip 74 and processing chip 78 are flip-chip mounted on the lower surface of lens block 92. As illustrated in FIG. 21, system substrate 72 is also fabricated, including providing conductive traces and the array of electrical contacts 90, or other substrate electrical conductors. Cavity 86 (FIG. 21) is also formed in system substrate 72. Lens block 92 is then mounted on the upper surface of system substrate 72, over opto-electronic chip 74 and processing chip 78, as illustrated in FIG. 22.

Figure 23:
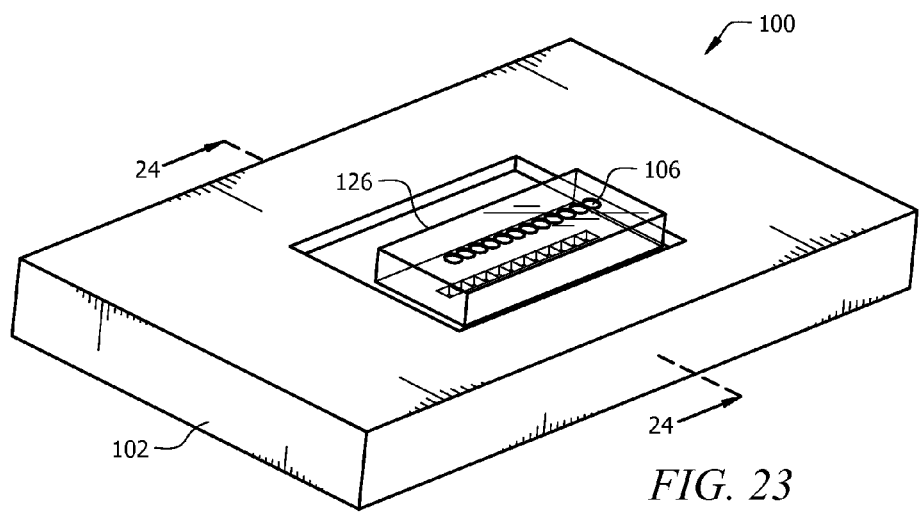
FIG. 23 is a perspective view of an opto-electronic system, in accordance with yet another exemplary embodiment of the invention.
Figure 24:
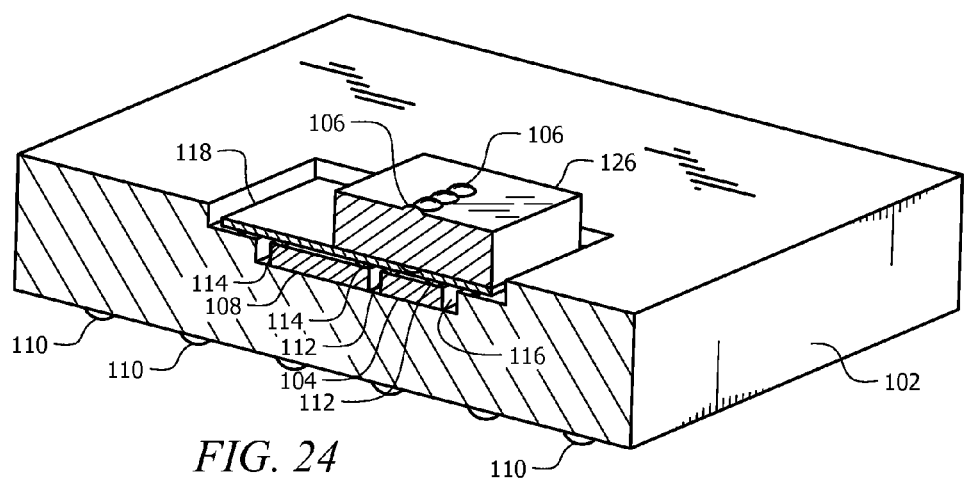
FIG. 24 is a sectional view taken on line 24-24 of FIG. 23.

As illustrated in FIGS. 23-24, in still another exemplary embodiment of the invention, an opto-electronic system 100 includes a system substrate 102, an opto-electronic chip 104, lenses 106, and a processing chip 108. The lower surface of system substrate 102 has an array of substrate lower electrical contacts 110 (FIG. 24), such as a ball grid array (BGA), to facilitate electrical mounting of opto-electronic system 100 to a surface of a printed circuit board (not shown) of an external system.

As opto-electronic chip 104 can be similar to above-described opto-electronic chips 14, 44 and 74, opto-electronic chip 104 is not described in similar detail for purposes of clarity. Accordingly, in this embodiment opto-electronic chip 104 has an array or plurality VCSEL structures and corresponding VCSEL regions (not shown for purposes of clarity) on its upper surface. The upper surface of opto-electronic chip 104 has an array of electrical contacts 112 (FIG. 24), such as solder bumps. Although for purposes of illustration the exemplary embodiment shown in FIGS. 23-24 includes only a single monolithic opto-electronic chip 104, other embodiments can include more than one such opto-electronic chip, each having one or more VCSELs or other optical signal sources. In an embodiment (not shown) in which each of a number of opto-electronic chips includes an optical signal source, the optical signal source of each such opto-electronic chip can be electrically isolated from the optical signal sources of the other opto-electronic chips.

As processing chip 108 can be similar to above-described processing chips 20, 48 and 78, processing chip 108 is not described in similar detail for purposes of clarity. The lower surface of processing chip 108 has an array of electrical contacts 114 (FIG. 24), such as solder bumps.

System substrate 102 can be made of a thermally conductive ceramic material, such as aluminum nitride. Other thermally conductive ceramic materials (e.g., having a thermal conductivity greater than about 100 W/m·K) may also be suitable. Opto-electronic chip 104 is mounted at the bottom of a recess or cavity 116 in the upper surface of system substrate 102. Cavity 116 has a stepped shape, with a lower portion of cavity 116 serving to receive opto-electronic chip 104 and processing chip 108. However, in other embodiments such a cavity can have no steps or more than one step. Although not shown for purposes of clarity, system substrate 102 includes electrical conductors, such as circuit traces and vias. These substrate electrical conductors include an array of electrical contacts (not shown for purposes of clarity), such as conductive pads, on the upper step or shelf in cavity 116.

Figure 25:
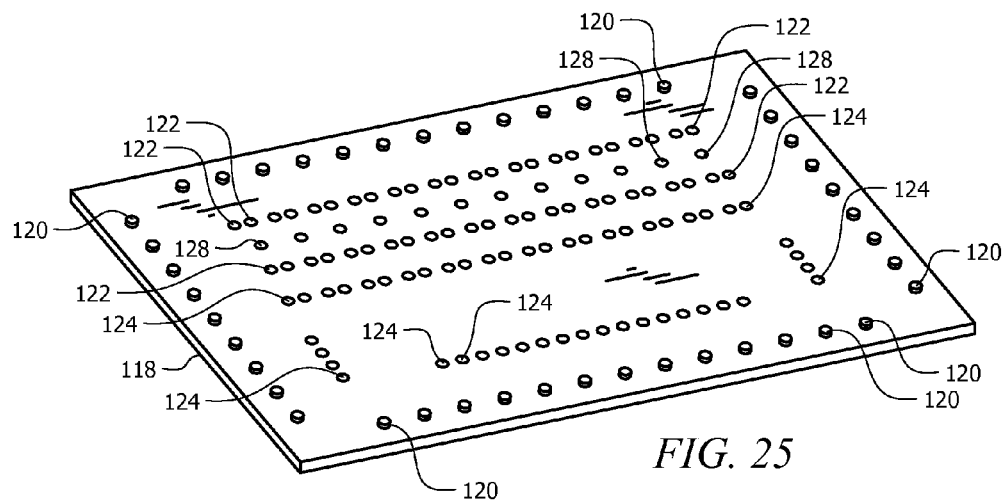
FIG. 25 is a perspective view illustrating a first step in an exemplary method of making the opto-electronic system of FIG. 23.
Figure 26:
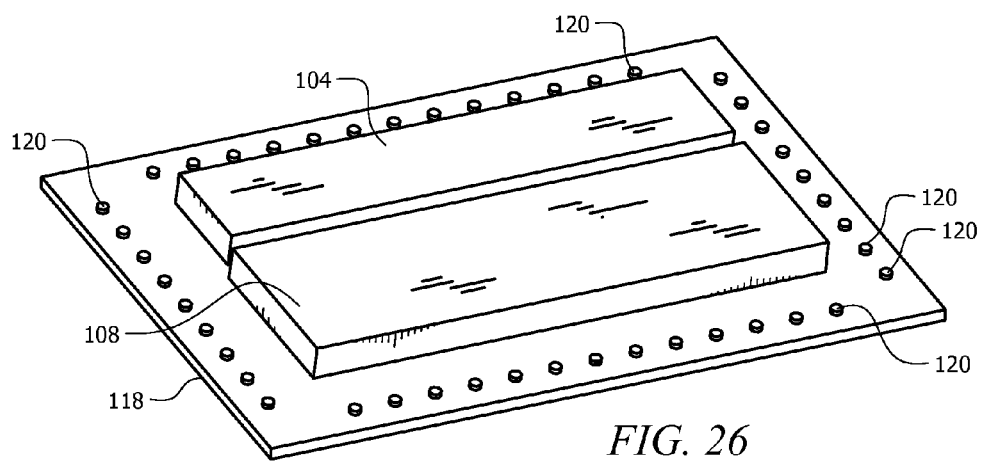
FIG. 26 is a perspective view illustrating a second step in an exemplary method of making the opto-electronic system of FIG. 23.

An interposer 118 is mounted atop opto-electronic chip 104 and processing chip 108. Interposer 118 can have a substantially planar or chip-like shape and can be made of, for example, silicon. Interposer 118 includes electrical conductors, such as circuit traces, which are formed on the lower surface of interposer 118 but are not shown for purposes of clarity. As illustrated in FIGS. 25-26, these interposer electrical conductors include arrays of electrical contacts 120, 122 and 124 on the lower surface of interposer 118. In this embodiment, interposer 118 serves as a bridge or interface between opto-electronic chip 104 and processing chip 108 and also between processing chip 108 and system substrate 102 because the interposer electrical conductors route electronic signals among opto-electronic chip 104, processing chip 108 and system substrate 102. The electrical coupling between system substrate 102 and interposer electrical conductors is provided by the array of electrical contacts 120 on the lower surface of interposer 118 in contact with the array of electrical contacts (not shown) on an upper surface of system substrate 102. The electrical coupling between opto-electronic chip 104 and interposer electrical conductors is provided by the array of electrical contacts 122 on the lower surface of interposer 118 in contact with the array of electrical contacts 112 (FIG. 24) on the upper surface of opto-electronic chip 104. The electrical coupling between processing chip 108 and interposer electrical conductors is provided by an array of electrical contacts 124 on the lower surface of interposer 118 in contact with the array of electrical contacts 114 (FIG. 24) on the upper surface of processing chip 108. In operation of opto-electronic system 100, processing chip 108 controls opto-electronic chip 104 in response to signals that processing chip 108 receives from system substrate 102 via the electrical conductors of interposer 118.

Note that in this embodiment interposer 118 also serves as a bridge in a mechanical sense in that it is mounted atop and spans system substrate 102, opto-electronic chip 104, and processing chip 108. This mechanical bridging is facilitated by the upper surface of opto-electronic chip 104 and its array of electrical contacts (not shown) being substantially co-planar or level with the upper surface of processing chip 108 and its array of electrical contacts (not shown) as well as being substantially co-planar or level with the upper surface of system substrate 102 and its arrays of electrical contacts 120, 122 and 124.

Lenses 106 are formed in an array on the upper surface of a lens block 126. Lens block 126 is mounted on top of interposer 118. Interposer 118 has an array of apertures 128 that are vertically aligned with the array of VCSEL regions (not shown) on the upper surface of opto-electronic chip 104. In operation, optical signals emitted from the array of VCSEL regions pass through apertures 128 and into lens block 126, where the signals impinge upon corresponding lenses 106. Lenses 106 focus and emit these signals or beams.

Figure 27:
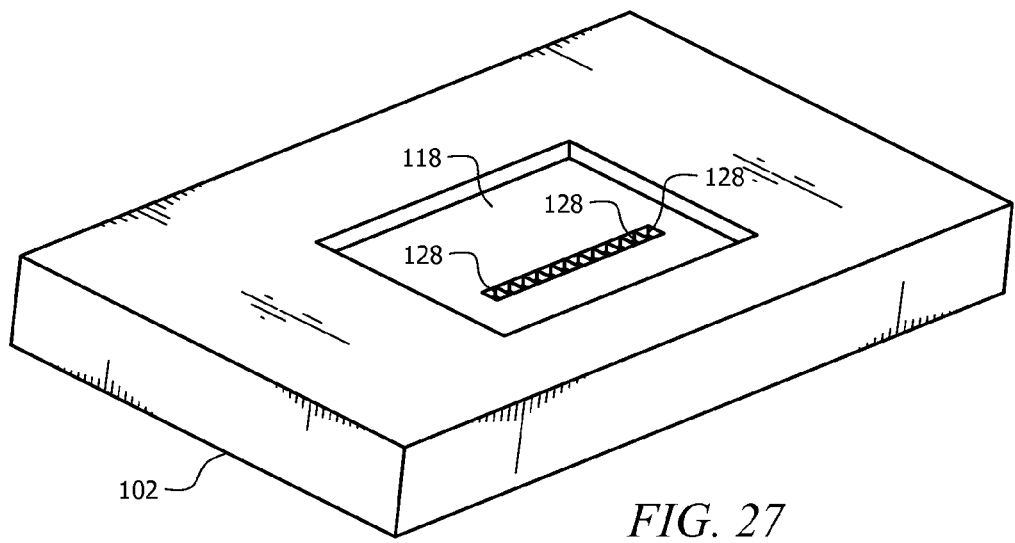
FIG. 27 is a perspective view illustrating a third step in an exemplary method of making the opto-electronic system of FIG. 23.
Figure 28:
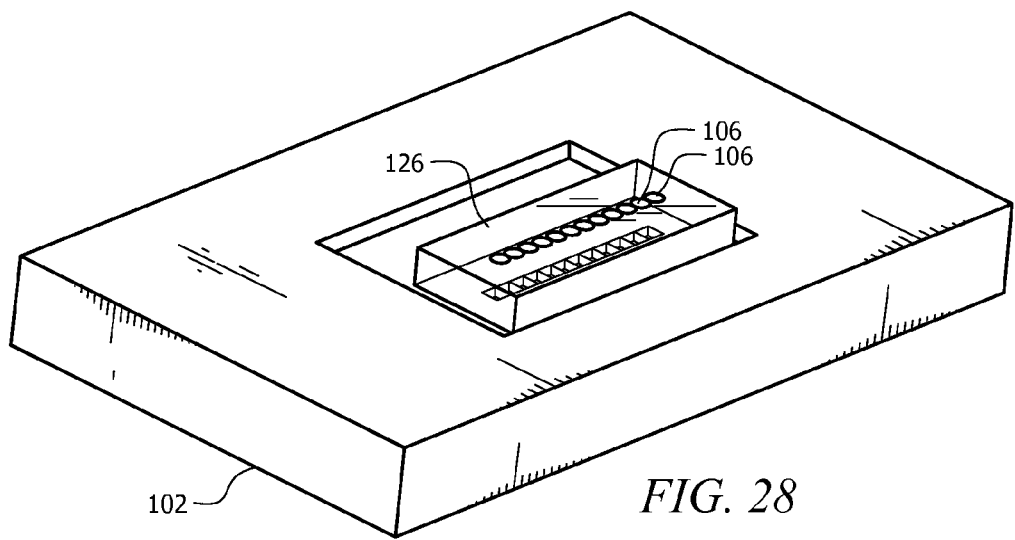
FIG. 28 is a perspective view illustrating a fourth step in an exemplary method of making the opto-electronic system of FIG. 23.

An exemplary method for fabricating opto-electronic system 100 can be described with reference to FIGS. 25-28. As illustrated in FIG. 25, interposer 118 is fabricated, including providing conductive traces and the arrays of electrical contacts 120, 122 and 124, or other interposer electrical conductors. Then, as illustrated in FIG. 26, opto-electronic chip 104 and processing chip 108 are flip-chip mounted on the lower surface of interposer 118. System substrate 102 is also fabricated, including providing conductive traces and the array of electrical contacts (not shown) on its upper surface. Cavity 116 (FIG. 24) is also formed in system substrate 102. The assembly comprising interposer 118, opto-electronic chip 104 and processing chip 108 is then mounted in cavity 116, as illustrated in FIG. 27. As illustrated in FIG. 28, lens block 126 is then mounted on interposer 118, such that its lenses 106 are aligned with the corresponding apertures 128 in interposer 118.

One or more illustrative embodiments of the invention have been described above. However, it is to be understood that the invention is defined by the appended claims and is not limited to the specific embodiments described.

What is claimed is:

1. An opto-electronic system, comprising:
a system substrate having a substantially planar substrate upper surface and a substantially planar substrate lower surface, the substrate lower surface having an array of substrate lower electrical contacts, the substrate upper surface having substrate electrical conductors and an array of substrate upper electrical contacts interconnecting at least a portion of the substrate electrical conductors, the substrate having a cavity extending from the substrate upper surface to an interior of the substrate;
an opto-electronic chip mounted in the cavity, the opto-electronic chip comprising an opto-electronic chip substrate having formed thereon at least one of an optical signal source for emitting optical signals and an optical signal detector for receiving optical signals, opto-electronic chip having a substantially planar opto-electronic chip upper surface and a substantially planar opto-electronic chip lower surface, the opto-electronic chip lower surface defined by a lower surface of the opto-electronic chip substrate, the opto-electronic chip having at least one optical region configured for communication of optical signals through the opto-electronic chip upper surface, the opto-electronic chip upper surface further having an array of opto-electronic chip electrical contacts disposed in an orientation substantially co-planar with the substrate upper surface;
a lens optically aligned with the at least one optical region; and
a bridging device disposed between the lens and the opto-electronic chip upper surface, the bridging device having a substantially planar bridging device upper surface and a substantially planar bridging device lower surface, the bridging device lower surface having a first array of device electrical contacts in contact with at least a portion of the array of substrate upper electrical contacts, the bridging device lower surface further having a second array of device electrical contacts in contact with at least a portion of the array of opto-electronic chip electrical contacts, the bridging device thereby electrically bridging the substrate and the opto-electronic chip.

2. The opto-electronic system of claim 1, wherein the system substrate comprises an organic printed circuit board material.

3. The opto-electronic system of claim 2, further comprising a heat spreader in thermal contact with the opto-electronic chip lower surface and a surface of the system substrate within the substrate cavity.

4. The opto-electronic system of claim 3, wherein the system substrate comprises a thermally conductive ceramic material.

5. The opto-electronic system of claim 4, wherein the thermally conductive ceramic material comprises aluminum nitride.

6. The opto-electronic system of claim 2, wherein the lens is formed on a lower surface of a lens block, and the bridging device is disposed between the opto-electronic chip and the lens block.

7. The opto-electronic system of claim 2, wherein the bridging device comprises a processing chip having at least one of a signal driver electrically coupled to the optical signal source and a signal receiver electrically coupled to the optical signal receiver.

8. The opto-electronic system of claim 7, further comprising a heat sink thermally coupled to the substrate upper surface and to the bridging device upper surface.

9. The opto-electronic system of claim 8, wherein the heat sink is thermally coupled to the bridging device upper surface via a heat spreader having a heat spreader lower surface and a heat spreader upper surface, the heat spreader lower surface in thermal contact with the bridging device upper surface, the heat spreader upper surface in thermal contact with the heat sink.

10. The opto-electronic system of claim 9, wherein the lens is formed on a lower surface of a lens block, and the lens block is mounted at least partly on the heat sink.

11. The opto-electronic system of claim 1, wherein the system substrate comprises a thermally conductive ceramic material.

12. The opto-electronic system of claim 11, wherein the thermally conductive ceramic material comprises aluminum nitride.

13. The opto-electronic system of claim 12, wherein the opto-electronic chip lower surface is in thermal contact with an aluminum nitride surface of the system substrate within the substrate cavity.

14. The opto-electronic system of claim 1, wherein the bridging device comprises a lens block made of a material transparent to the optical signals, and the lens is formed on the bridging device upper surface, the bridging device lower surface having electrical conductors connecting at least a portion of the array of substrate upper electrical contacts and at least a portion of the array of opto-electronic chip electrical contacts.

15. The opto-electronic system of claim 14, further comprising a processing chip mounted in the cavity of the system substrate and having at least one of a signal driver electrically coupled to the optical signal source and a signal receiver electrically coupled to the optical signal receiver, the processing chip having a substantially planar processing chip upper surface and a substantially planar processing chip lower surface, the processing chip upper surface disposed in an orientation substantially co-planar with the substrate upper surface.

16. The opto-electronic system of claim 1, wherein:
the bridging device comprises a monolithic interposer having an aperture optically aligned with the at least one optical region and the lens, the bridging device lower surface having electrical conductors connecting at least a portion of the array of substrate upper electrical contacts and at least a portion of the array of opto-electronic chip electrical contacts; and the lens is formed on an upper surface of a lens block made of a material transparent to the optical signals, the lens block having a lower surface mounted on the bridging device upper surface.

17. A method of operation in an opto-electronic system comprising a system substrate, a lens, a bridging device, and an opto-electronic chip mounted in a cavity in the system substrate, the bridging device disposed between the lens and the opto-electronic chip, the method comprising:
communicating optical signals at a substantially planar opto-electronic chip upper surface of the opto-electronic chip and through the lens;
communicating electrical signals between an external electronic device and an array of substrate lower electrical contacts on a substantially planar substrate lower surface of the system substrate;
communicating electrical signals between a first array of device electrical contacts on a substantially planar lower surface of the bridging device and an array of substrate upper electrical contacts on a substantially planar substrate upper surface of the system substrate; and
communicating electrical signals between a second array of device electrical contacts on the lower surface of the bridging device and at least a portion of an array of opto-electronic chip electrical contacts disposed on the opto-electronic chip upper surface in an orientation substantially co-planar with the substrate upper surface.

18. The method of claim 17, wherein the system substrate is made of an organic printed circuit board material, and further comprising the step of a heat spreader disposed in the cavity spreading heat emitted from the opto-electronic chip lower surface away from an opto-electronic chip substrate of the opto-electronic chip.

19. The method of claim 17, wherein the system substrate is made of a thermally conductive ceramic material, and further comprising the step of the system substrate spreading heat emitted from the opto-electronic chip lower surface away from an opto-electronic chip substrate of the opto-electronic chip.

20. The method of claim 17, further comprising communicating electrical signals between a portion of the second array of device electrical contacts and a corresponding array of contacts on an upper surface of a processing chip mounted in the cavity of the system substrate in an orientation wherein the upper surface of the processing chip is substantially co-planar with the substrate upper surface and the opto-electronic chip upper surface.

* * * * *